(12) United States Patent
Rao

(10) Patent No.: US 6,359,947 B1
(45) Date of Patent: Mar. 19, 2002

(54) SPLIT CLOCK BUFFERS FOR A NEGATIVE CHARGE PUMP

(75) Inventor: Hari M. Rao, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/387,641

(22) Filed: Aug. 31, 1999

(51) Int. Cl.[7] .................................. H03D 3/24
(52) U.S. Cl. ...................... 375/374; 327/536
(58) Field of Search .................. 375/374; 327/536, 327/530, 306; 365/226, 218, 149

(56) References Cited

U.S. PATENT DOCUMENTS

| 5,394,027 A | 2/1995 | Park |
| 5,414,669 A | 5/1995 | Tedrow et al. |
| 5,442,586 A | 8/1995 | Javanifard et al. |
| 5,455,794 A | 10/1995 | Javanifard et al. |
| 5,483,486 A | 1/1996 | Javanifard et al. |
| 5,524,266 A | 6/1996 | Tedrow et al. |
| 5,532,915 A * | 7/1996 | Pantelakis et al. ............ 363/60 |
| 5,553,030 A | 9/1996 | Tedrow et al. |
| 5,553,295 A | 9/1996 | Pantelakis et al. |
| 5,589,793 A | 12/1996 | Kassapian |
| 5,602,794 A | 2/1997 | Javanifard et al. |
| 5,612,921 A | 3/1997 | Chang et al. |
| 5,734,290 A | 3/1998 | Chang et al. |
| 5,754,476 A | 5/1998 | Caser et al. |
| 5,801,577 A | 9/1998 | Taillet |
| 5,818,289 A | 10/1998 | Chevallier et al. |
| 5,821,805 A | 10/1998 | Jinbo |
| 5,973,979 A * | 10/1999 | Chang et al. ............... 365/226 |
| 6,166,440 A | 12/2000 | Javanifard et al. |

FOREIGN PATENT DOCUMENTS

EP          0 678 970 A2    10/1995

OTHER PUBLICATIONS

International Search Report in connection with International Application No. PCT/US00/22793 (4 pages).

* cited by examiner

*Primary Examiner*—Don N. Vo
(74) *Attorney, Agent, or Firm*—Blakely, Sokoloff, Taylor & Zafman LLP

(57) ABSTRACT

A split clock buffer for providing clock signals to a negative charge pump. The split clock buffer receives a first phase and a second phase of the clock signal, pumps the voltage level of the first phase from a first voltage level to a second voltage level. Then, the buffer outputs the pumped first phase to a boot node of the negative charge pump, and outputs the second phase to a pump node of the negative charge pump.

37 Claims, 12 Drawing Sheets

SPLIT CLOCK BUFFERS FOR A NEGATIVE CHARGE PUMP

FIELD OF THE INVENTION

The present invention relates generally to systems, and more particularly, to a buffer for use with a charge pump.

BACKGROUND OF THE INVENTION

There has been a trend toward lowering the power requirements of personal computers and other electronic devices, including mobile electronic systems. In order to reduce power consumption, much of the integrated circuitry used in personal computers is being redesigned to run at lower voltage supply levels. For example, many components that were previously designed to work with a 5 volt supply have been redesigned to work with a 3.3 volt supply. Some newer products, and many in development, have even lower supply voltages, which, in many cases, may be below 2 volts. Scaling of process technology is a key factor for power supply reduction due to reliability.

While supply voltages are being reduced, higher voltages may continue to be used for some computer system features. For example, a flash electrically erasable programmable memory (EEPROM) may be used in some computer systems to store the basic input/output system (BIOS) or as a random access memory storage device in various electronic systems. Flash memory devices typically use a much higher voltage and higher internal power for programming and erasing data than can be provided directly by an external low voltage power supply.

For example, a negative gate erase technique may be used for some flash EEPROM arrays to reduce the amount of current, and thus, power, during an erase operation. The negative gate erase technique uses a large negative voltage (typically minus nine or ten volts) at the gate terminal of the memory deviced and Vcc at the source terminal.

To supply the desired negative voltage for a negative gate erase operation, a negative charge pump may be used. One type of negative charge pump is described in U.S. Pat. No. 5,532,915 to Pantelakis et al. and assigned to the assignee of the present invention.

The charge pump of Pantelakis has a drawback, however. At supply voltages below a given level, when p-type (also referred to as p-channel) transistors of Pantelakis are turned on, they may operate in a region in which the transistors experience a measurable threshold voltage drop. If the p-type transistors of Pantelakis are not "fully turned on" such that there is effectively no threshold voltage drop across them when they are operating, additional stages may be required to achieve the same pumped output voltage. Further, the current provided by the charge pump of Pantelakis will be reduced.

If the supply voltage drops below the threshold voltage of one or more of the p-channel transistors, one or more of the transistors may not even be turned on when desired. For example, if the threshold voltage of a series connected p-channel transistor is more than the gate source swing, which is equal to the external power supply, due to body effect, the transistor will not turn on adequately. In such a case, the negative pumped voltage may not be passed from one stage of the p-channel device to the next stage. In other words, below a given supply voltage, the negative charge pump of Pantelakis may not work.

SUMMARY OF THE INVENTION

A split clock buffer for providing clock signals to a negative charge pump is described. The split clock buffer receives a first phase and a second phase of the clock signal, pumps the voltage level of the first phase from a first voltage level to a second voltage level. Then, the buffer outputs the pumped first phase to a boot node of the negative charge pump, and outputs the second phase to a pump node of the negative charge pump.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and apparatus for providing a scaleable charge pump for use with a low voltage power supply is described. Although the following embodiments are described with reference to a flash memory used as a mass storage device, alternative embodiments are applicable to other types of circuits, including other types of nonvolatile memories, that may benefit from having a voltage higher or lower than the available supply voltage(s), and/or to other types of flash memories used for other purposes.

Figure 1:
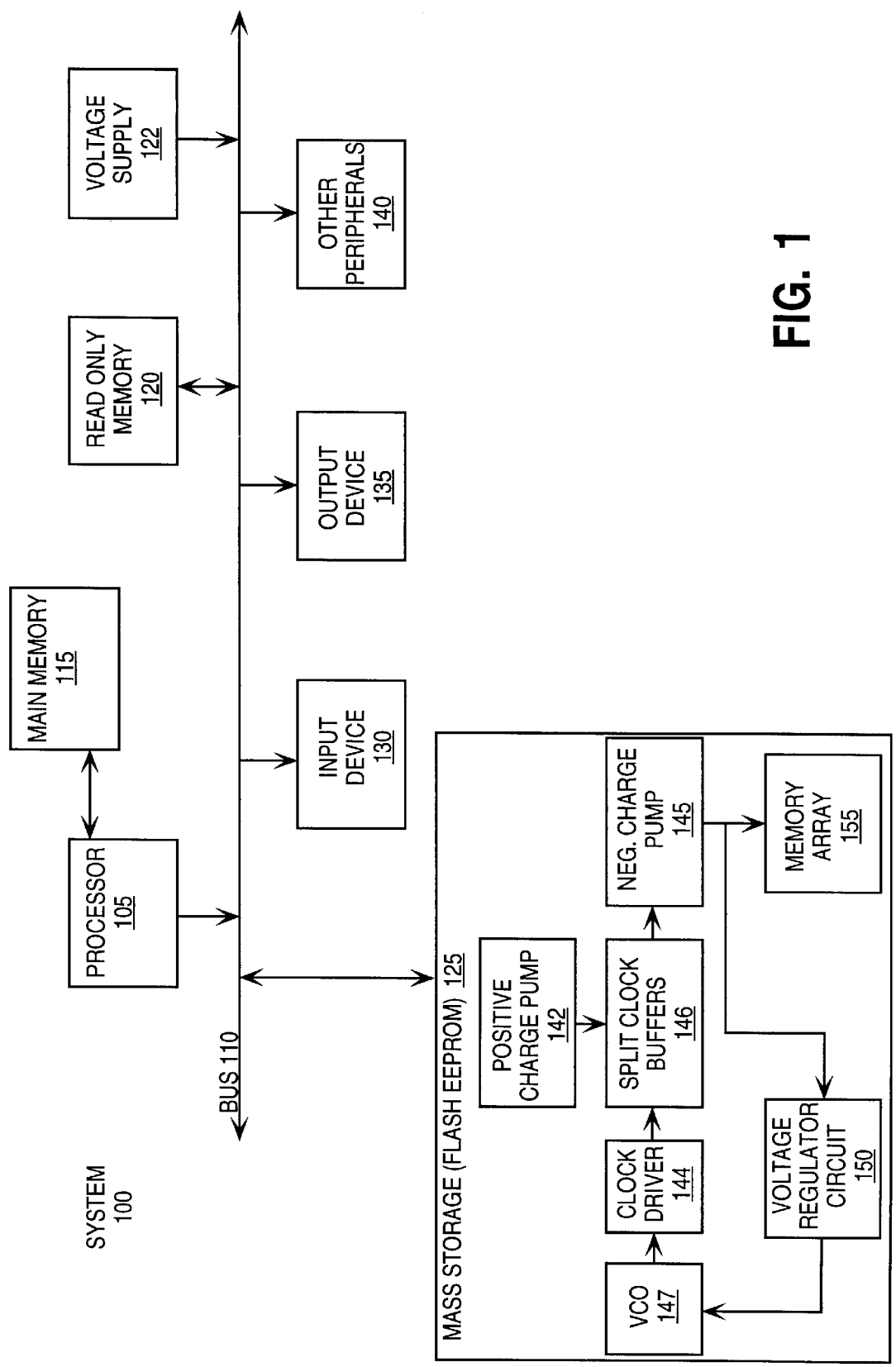
FIG. 1 is a block diagram of a computer system that may be advantageously used for one embodiment.

FIG. 1 shows a block diagram of a system 100 that may be advantageously used for one embodiment. The system 100 is a personal computer system, such as a laptop, for example. Alternatively, the system 100 may be another type of system such as a server, a digital camera, a digital signal processor (DSP), a system on a chip, a cellular telephone, or any other system which uses flash memory for other embodiments.

The computer system 100 includes a system bus 110 for communicating information between the various components of the computer system 100. A processor 105 for processing instructions is coupled to the system bus 110. The processor 105 is a microprocessor for one embodiment, but a DSP, a microcontroller, an application specific integrated circuit (ASIC) or other type of processor may be used for alternative embodiments. A main memory 115 for temporarily storing instructions and data for the processor 105 is coupled to the processor 105. The main memory 115 includes dynamic random access memory (DRAM), but may include a different type of memory for other embodiments.

Also coupled to the system bus 110 is a read only memory 120 to store static information for the processor 105, a voltage supply 122 to provide the system supply voltage Vcc over the bus 123, a mass storage device 125, an input device 130, such as a keyboard or a cursor control device, and an output device 135, such as a monitor and/or a printer. The system 100 may also include other peripheral components 140, such as a memory controller and/or a bus bridge device, for example.

The system supply voltage Vcc for one embodiment is 1.8 volts +/−150 millivolts (mV) and is provided by a low powered battery. For alternative embodiments, the supply voltage may be higher or lower and may be provided by another type of voltage source.

For one embodiment, the mass storage device 125 comprises flash memory, also referred to as flash electrically erasable programmable read only memory (EEPROM), which could store telephone numbers, for example. The mass storage device 125 may use a flash file system, and may serve the same function as a conventional hard disk drive for the embodiment shown in FIG. 1. The flash EEPROM mass storage device 125 of one embodiment includes one or more positive charge pump(s) 142, a clock driver 144, split clock buffers 146, a negative charge pump 145, a voltage controlled oscillator (VCO) 147, a voltage regulator circuit 150 and an array of flash memory cells 155. For other embodiments, the mass storage device 125 may be configured in a different manner. The charge pumps 142 and 145, the clock driver 144, the voltage controlled oscillator 147 and the voltage regulator circuit 150 are described in more detail below with reference to FIGS. 3–6.

Systems configured in a manner other than that shown in FIG. 1 may also be used with alternative embodiments.

Figure 2:
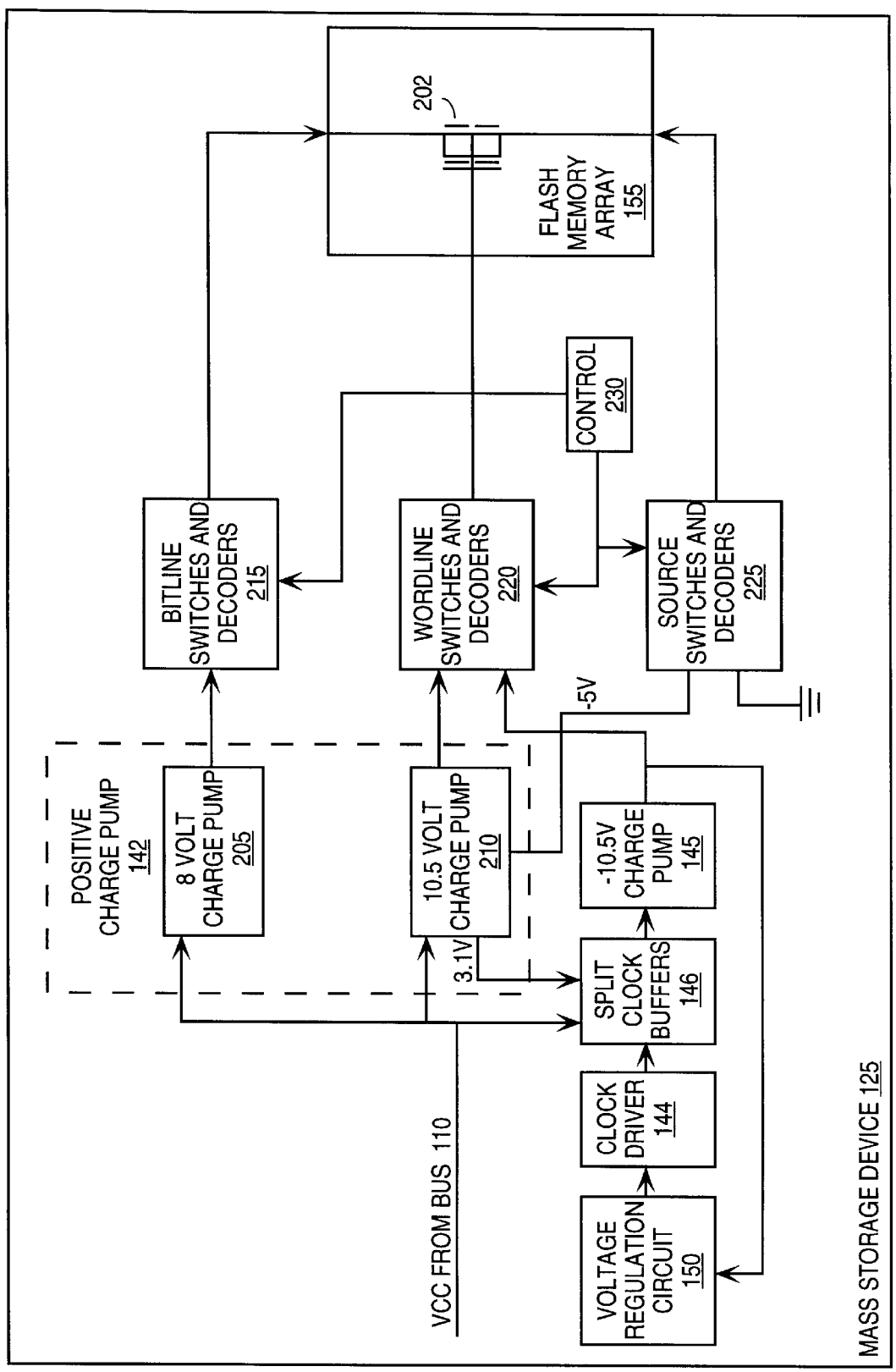
FIG. 2 is a block diagram showing the mass storage device of FIG. 1 in more detail.

FIG. 2 shows the mass storage device 125 in more detail. In particular, FIG. 2 shows circuitry of one embodiment for programming and erasing cells of the flash memory array 155, such as the cell 202. For purposes of illustration, only one memory cell 202 of the memory array 155 is shown in FIG. 2.

For this embodiment, a negative erase technique is used to erase memory cells such as the memory cell 202. The negative erase technique involves the application of a large negative voltage, −10.5 volts for this example, to the gate terminal(s) of memory cell(s) to be erased, while Vcc is provided at the source terminal(s). The Vcc voltage applied at the source terminal(s) is low enough such that the source-substrate junction diode of the memory cell(s) being erased is not broken down. In this manner, only a relatively small source current flows during the erase process. Thus, even though the voltage differential between the gate and source of the device(s) being erased is similar to the differential for a positive erase technique, the negative erase technique requires less current.

Turning to further details of the flash EEPROM mass storage device 125, for one embodiment, the positive charge pump(s) 142 include an 8 volt charge pump 205 and a 10.5 volt charge pump 210. The 8 volt charge pump and the 10.5 volt charge pump may be configured in any manner. For one embodiment, the 8 volt charge pump and the 10.5 volt charge pump are configured in a manner similar to the negative charge pump 145 as described in more detail below. Vcc from the bus 110 (FIG. 1) is supplied to the two charge pump circuits 205 and 210 included within the positive charge pumps 142.

During operations to program one or more cells in the flash memory array 155, a voltage from the charge pump 205 is supplied to a set of bitline switches and decoders 215 that provide voltages to the drain terminals of flash memory cells in the flash memory array 155. Further, a voltage from the charge pump 210 is supplied to a set of wordline switches and decoders 220 that supply voltages to the gate(s) of memory cell(s). During operations to erase one or more cells in the flash memory array 155, a voltage from the negative charge pump 145 is supplied to the wordline switches and decoders 220 while approximately 5 volts from one of the positive charge pumps 142 is supplied to a set of source switches and decoders 225. A different voltage may be supplied to the source switches and decoders for other embodiments. The source switches and decoders 225 supply voltages to the source(s) of memory cell(s) to be erased. The switches and decoders 215, 220 and 225 operate in a manner well-known to those skilled in the art to select particular memory cells to be accessed and to supply the appropriate voltages to the memory cells for the memory access operation being performed.

Each of the sets of switches and decoders 215, 220 and 225 may be controlled by signals from a control circuit 230 to provide the appropriate voltages for erase and programming operations. For one embodiment, the control circuit is a processor designed to provide control of all of the operations of the memory array 155 including reading, programming and erasing operations. The use of such a control circuit is described in U.S. Pat. No. 5,509,134 entitled "Method and Apparatus for Execution of Operations in a Flash Memory Array", M. Fandrich et al., issued Apr. 16, 1996 and assigned to the assignee of the present invention. For alternative embodiments, the control function may be provided in a different manner using an external source of control such as a microprocessor, for example.

For one embodiment, to accomplish negative erase of one or more memory cells in the flash memory array 155, a precise negative voltage is supplied from the negative charge pump 145 through the wordline switches and decoders 220 to the gate(s) of the particular memory cell(s) to be erased.

Figure 3:
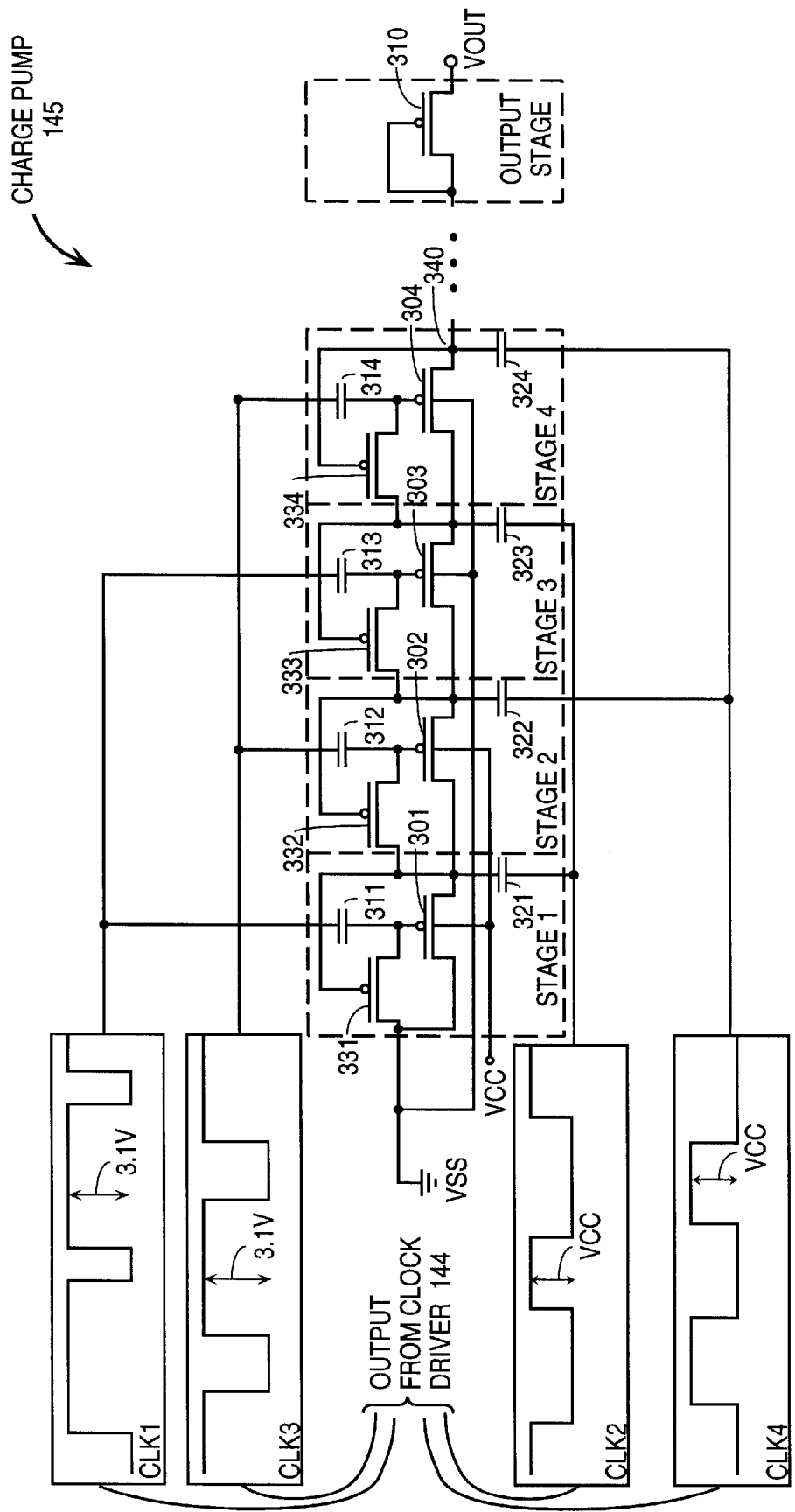
FIG. 3 shows the negative charge pump of FIGS. 1 and 2 in more detail.

FIG. 3 shows the negative charge pump 145 of FIGS. 1 and 2 in more detail. The arrangement of the charge pump 145 shown in FIG. 3 may be used to provide a number of different negative voltage levels including the low negative voltages (i.e. negative voltages large in magnitude) used to erase flash EEPROM memory cells with a negative erase technique.

A first set of input clock signals are supplied to the charge pump 145 via capacitors 311–314 from the sources illustrated as clock 1 and clock 3. A second set of input clock signals are supplied via capacitors 321–324 from the sources illustrated as clock 2 and clock 4.

The charge pump 145 of one embodiment includes p-channel field effect transistors (FETs) 301–304 and 310 connected in series. The transistor 301 has one terminal coupled to ground while the transistor 310 has one terminal coupled to an output terminal Vout. The device 310 is referred to herein as an output stage device. The threshold voltages for the p-channel transistors 301–304 and 310 are approximately 1.5 volts for one embodiment, but may be higher or lower for alternative embodiments.

In addition to the series coupled p-channel transistors 301–304 and 310, each of the stages 1–4 of the charge pump 145 also includes a bootstrap p-channel transistor, 331–334, respectively. The bootstrap transistors 331–334 are used to precharge the gate terminal of the series coupled p-channel device of the corresponding stage. Thus, for example, the first stage (stage 1) of the charge pump 145 is comprised of the transistor device 301, bootstrap transistor device 331 and the capacitors 311 and 321.

For one embodiment, the substrates of the transistors 301 and 302 are coupled to Vcc and the substrates of the transistors 303 and 304 are coupled to Vss. The substrates of the transistors 301 and 302 are coupled to Vcc to prevent latch-up and/or other quality problems that may occur during initial clock cycles to the charge pump 145. If the substrates of the transistors 301 and 302 are coupled to Vss, initial clock cycles to the charge pump 145 may erroneously forward bias the junctions of the transistors 301 and 302. The transistors 303 and 304 are further away from the Vss supply and thus, can have their substrates coupled to Vss with a much lower risk of such issues. The transistors 301–304, 310 and 331–334 of the charge pump 145 may be metal oxide semiconductor (MOS) transistors for one embodiment, however other types of transistors may be used for alternative embodiments.

Two of the clock signals shown in FIG. 3, clock 2 and clock 4, provide a high value of Vcc and a low value of ground. The magnitude of these clock signals (the difference between the high value and the low value of the clock signal) is Vcc. The clock 1 and clock 3 signals, however, provide a high value of 3.1 volts and a low value of ground. The clock 1 and clock 3 signals thus have a magnitude of 3.1 volts. The clock signals 1 and 3 are referred to herein as pumped clock signals because their magnitude is pumped to be higher than Vcc for this example. The manner in which the clock 2 and clock 4 signals and the pumped clock 1 and clock 3 signals are generated is described in more detail below.

While FIG. 3 shows stages 1–4 of the charge pump 145 in detail. For one embodiment, eight stages are used to supply the −10.5 volts used to erase memory cells of the flash memory array 155. The remaining stages 5–8 are coupled in series between stage 4 and the transistor device 310 in a manner similar to stages 1–4.

In order to describe the operation of the charge pump circuit 145, the operation of a single stage, stage 2, will be discussed. Following the timing diagrams corresponding to the clock signals 1–4 shown in FIG. 3, clock 1 and clock 4 signals are initially low. Because the clock 4 signal is low, the device 332 is initially on. When the clock 2 signal goes low, the negative voltage pulse applied through the capacitor 321 charges the capacitor 312 at the gate terminal of the device 302 through the device 332 to the negative voltage level of the source terminal of the device 302. When the clock 4 signal then goes high, the device 332 turns off, isolating the gate of the device 302 and leaving the capacitor 312 charged to a negative level.

When the clock 3 signal then goes low, because the magnitude of the pumped clock 3 signal is 3.1 volts in this example, and because the capacitor 312 has been precharged to a negative value, the voltage at the gate terminal of the device 302 is appreciably lower than the voltage at its source terminal. Thus, the device 302 is turned on in a region in which it experiences effectively no threshold voltage (Vt) drop. Having the Vt drop across the device 302 effectively equal to 0 means that increased current is transferred more rapidly from the capacitor 321 to the next stage and the voltage passed on to the next stage is of a higher magnitude.

The low clock 2 pulse at the capacitor 321 begins to charge the capacitor 322 toward a value of minus Vcc. When the clock 3 signal then goes high, the device 302 begins to turn off. When the clock 4 signal goes low, the capacitor 322 is charged to approximately minus twice Vcc. The device 332 turns on discharging the gate of the device 302 and bringing it toward the voltage of its drain so that the device 302 turns off rapidly. When the clock 2 signal then goes high, the device 302 stays off and the device 332 stays on so that the charge at the drain and gate terminals of the device 302 is equalized.

Viewing the charge pump circuit 145 as a whole, when the device 301 comes on in response to the falling edge of the pumped clock 1 signal, the capacitor 311 at its gate terminal has been placed at ground through the device 331 which has been turned off. Thus, the gate terminal of the device 301 is forced much lower than its source terminal due to the magnitude of the pumped clock 1 signal. The device 301 is therefore turned on such that it operates in a region in which there is effectively no Vt drop across the device 301.

While turned on, the device 301 charges the capacitor 321 and the capacitor 312 (because the device 332 is also on during this time) to ground level very rapidly. Then, the device 301 begins to turn off as the clock 1 signal goes high. The drop of the clock 2 signal causes the capacitor 321 to go to minus Vcc and completes the turnoff of the device 301 by discharging the capacitor 311 through the device 331. The low clock 2 signal continues the charging of the capacitor 312 until the rise of the clock 4 signal turns off the device 332 leaving the gate of the device 302 charged. As explained above, the device 302 is turned on such that it operates in the region in which it experiences effectively no Vt drop when the pumped clock 3 signal goes low. This is because the low pulse of the pumped clock 3 signal causes the voltage at the gate terminal of the device 302 (which has been precharged to a negative value) to go below the voltage at the source terminal of the device 302. Turning on the device 302 in this manner allows the rapid charge of the capacitor 322 to a negative value of approximately minus twice Vcc.

The same sequence continues through stages 3 and 4 such that a voltage at the node 340 can reach a voltage of minus four times Vcc during operation of the charge pump 145. The same sequence also continues through the remaining stages 5–8 (not shown) until the charge on the last capacitor (not shown) coupled to the source of the device 310 is sufficient to turn on the device 310. For one embodiment, the device 310 is turned on to operate in a range in which it exhibits a Vt drop because a bootstrap transistor (such as the transistors 331–334) is not provided. Where the threshold voltage of the transistor 310 is 1.5 volts, the Vt drop is 1.5 volts.

Thus, the charge pump circuit 145 of FIG. 3 is arranged to provide a negative pumped output voltage having a magnitude approximately equal to the number of pump stages (N) times Vcc, minus the threshold voltage of the output stage device 310 for one embodiment (i.e. Vout=−((N*Vcc)−Vt) for a negative charge pump). For an eight stage charge pump such as the charge pump 145, the voltage at the output node Vout can thus reach approximately the negative of eight times Vcc minus Vt of the device 340, or the negative of 13.2 volts (using the worst case supply voltage of 1.65 for a Vcc of 1.8+/−150 mV) minus Vt of the device 310. If the device 310 has a Vt of 1.5, the charge pump 145 can provide a pumped output voltage Vout of approximately negative 11.7 volts. A pumped voltage or pumped output voltage, as the terms are used herein, refers to a voltage that is larger in magnitude than a given input voltage to a charge pump or other voltage increasing or decreasing circuitry, for example.

For other embodiments, the charge pump may include a larger or smaller number of stages than that shown in FIG. 3 to provide a charge pump that produces a different negative pumped output voltage for the same or another purpose. Although the pumped clock signals—clock 1 and clock 3 of FIG. 3—have a magnitude of 3.1 volts, for alternative embodiments the magnitude of the pumped clock signals may be higher or lower.

A similar charge pump may replace the p-channel transistors of the charge pump 145 with n-channel (also referred to as n-type) transistors. This charge pump receives a positive input voltage instead of ground at one end of the series coupled transistors. It may be used to provide the positive charge pump(s) 142 of FIGS. 1 and 2 or a positive charge pump for a different use.

Figure 4:
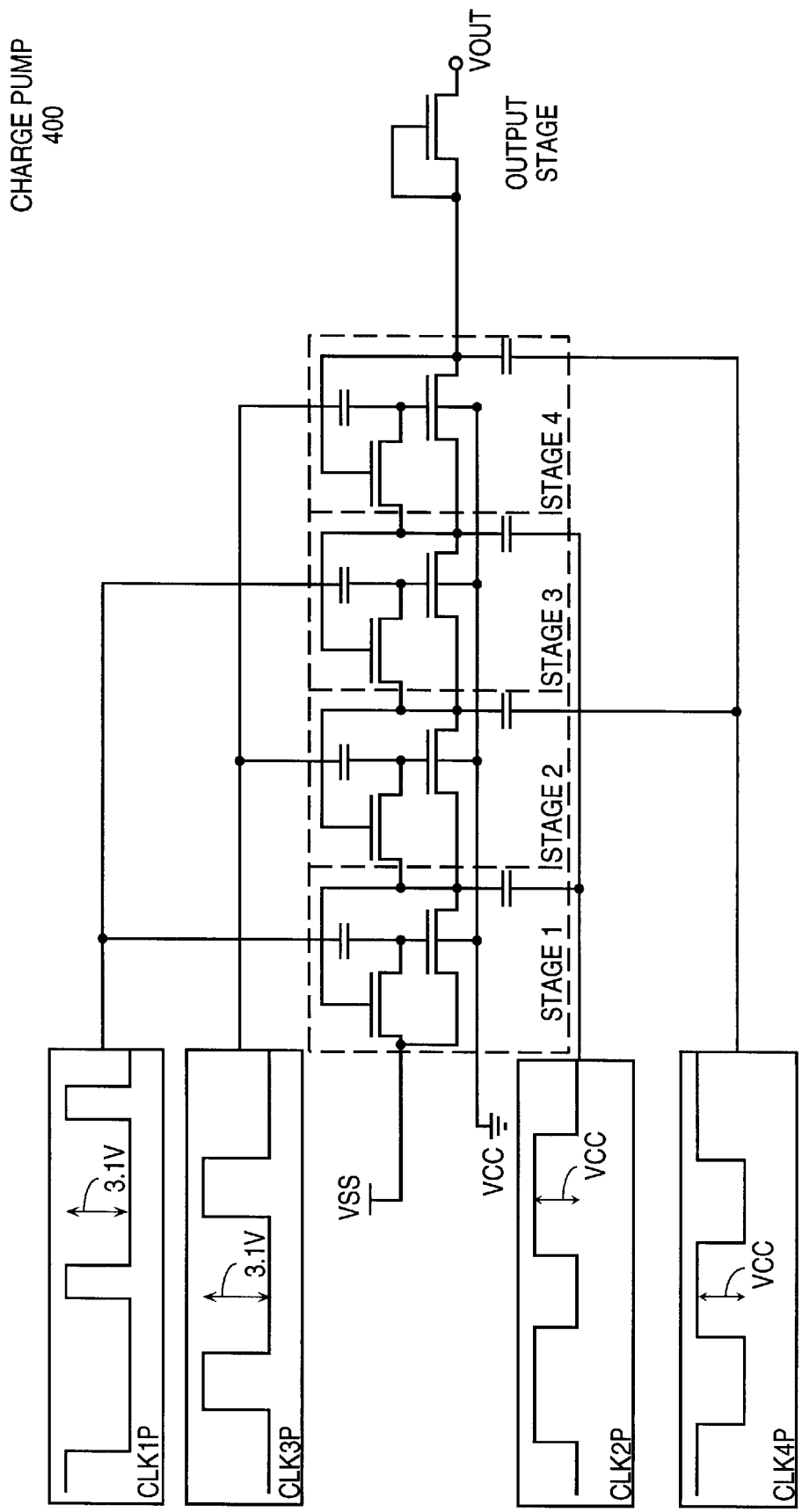
FIG. 4 is a circuit diagram showing one embodiment of a positive charge pump.

An example of such a charge pump is shown in FIG. 4. The charge pump 400 of FIG. 4 operates in a similar manner to the charge pump 145 of FIG. 3 but with the polarities of the signals and voltages reversed. A positive charge pump configured in the same manner as the charge pump 400 of FIG. 4 can provide a positive pumped voltage approximately equal to [(1+N)*Vcc]−Vt of the output stage device 405 where N is the number of pump stages provided in the positive charge pump. Thus, the positive charge pump 400 including 4 stages can provide a positive pumped output voltage of (5*1.65)−1.5=6.75 volts where a worst case Vcc of 1.65 is used and the threshold voltage of the output stage device 405 is 1.5 volts.

A positive charge pump such as the charge pump 400 may be used to provide the positive charge pump(s) 142 of FIGS. 1 and 2. Additionally, such a charge pump may be used for positive flash memory cell erase techniques for other embodiments and/or for other purposes for which a pumped voltage may be useful.

The pumped clocks 1 and 3 received by the negative charge pump 145 and the pumped clocks 1P and 3P received by the positive charge pump 400 provide for the charge pumps 145 and 400 to be scaleable to work with low supply voltages. By pumping the clock 1, 3, 1P and 3P signals such that they have a larger magnitude than a low supply voltage, the series-coupled transistors of the charge pump circuits 145 and 400 can operate in a range in which there is effectively no Vt drop across the transistors. In this manner, the number of charge pump stages does not have to be increased for a lower supply voltage to achieve the same pumped output-to-supply voltage relationship.

Further, by using the pumped clocks, the threshold voltages of some of the charge pump transistors for some embodiments may not need to be adjusted to accommodate lower supply voltages. Lower transistor threshold voltages can lead to issues of higher leakage current, for example.

A charge pump in accordance with one or more embodiments may even be operable with a supply voltage below the threshold voltage of one or more transistors in the charge pump. For some embodiments, in order to accomplish this, the clock 2 and clock 4 signals shown in FIG. 3 may also be pumped clock signals. For such embodiments, the number of charge pump stages used to provide a given pumped voltage may be decreased. Pumping the clock 2 and clock 4 signals, however, may decrease efficiency of such a charge pump circuit. For any given charge pump design, the tradeoffs of space, efficiency, threshold voltage, and supply voltage may be balanced.

Further, for both the negative charge pump 145 and the positive charge pump 400 of FIGS. 3 and 4, respectively, the output current at the output node Vout is proportional to the input clock frequency. Because the pumped clocks for both of the charge pumps 145 and 400 provide for the series-coupled transistors of each stage to operate in a region in which they experience effectively no Vt drop across them, the capacitors of the charge pumps 145 and 400 can be charged very rapidly. For some embodiments, this obviates the need to provide significant additional overlap between the various clock signals to provide more time for the capacitors to be charged. In this manner, relatively high frequency clock signals can be used to provide a relatively large output current.

Figure 5A:
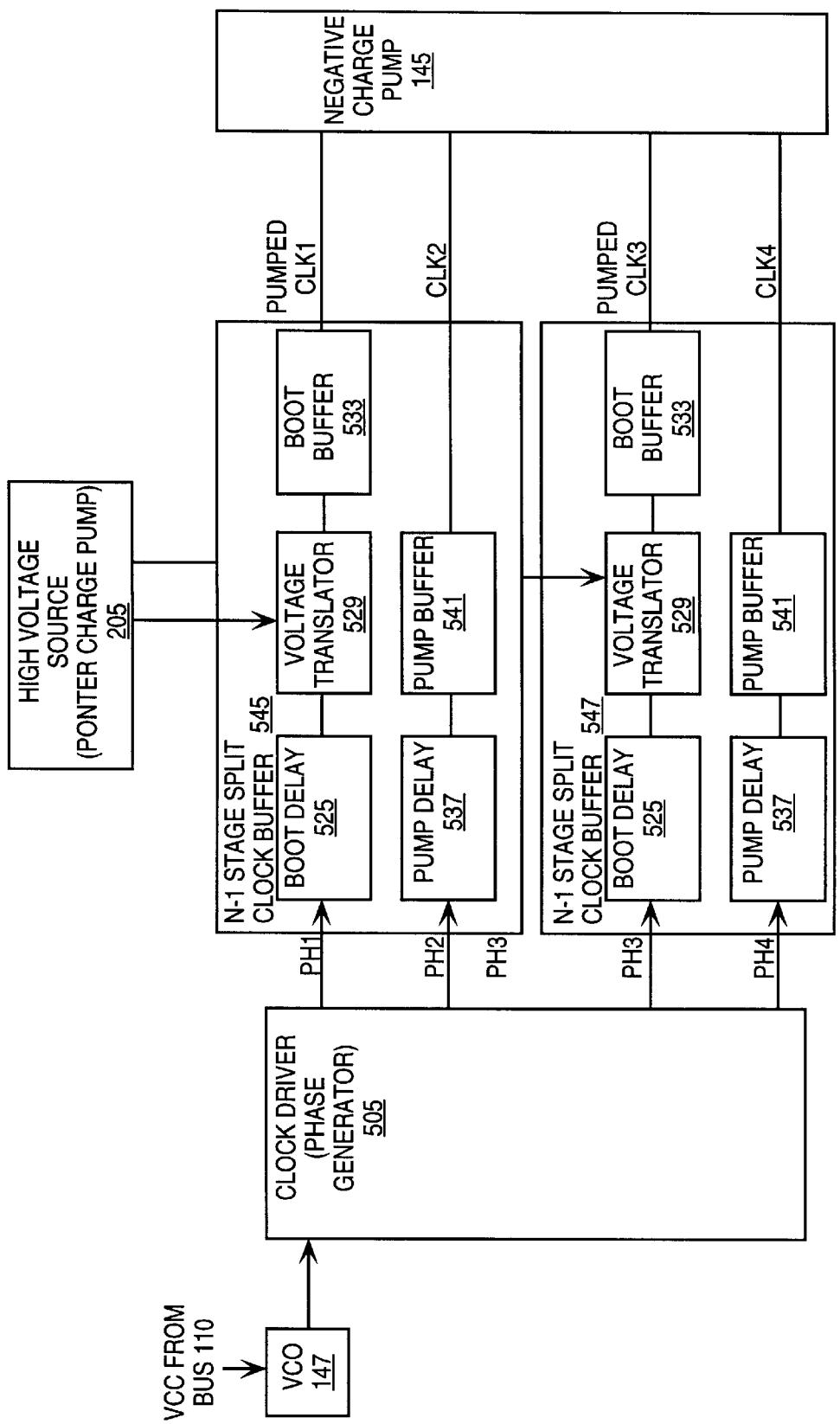
FIGS. 5A through 5C show examples of embodiments of the split clock buffer that produces the pumped clock signals of FIG. 3.
Figure 5B:
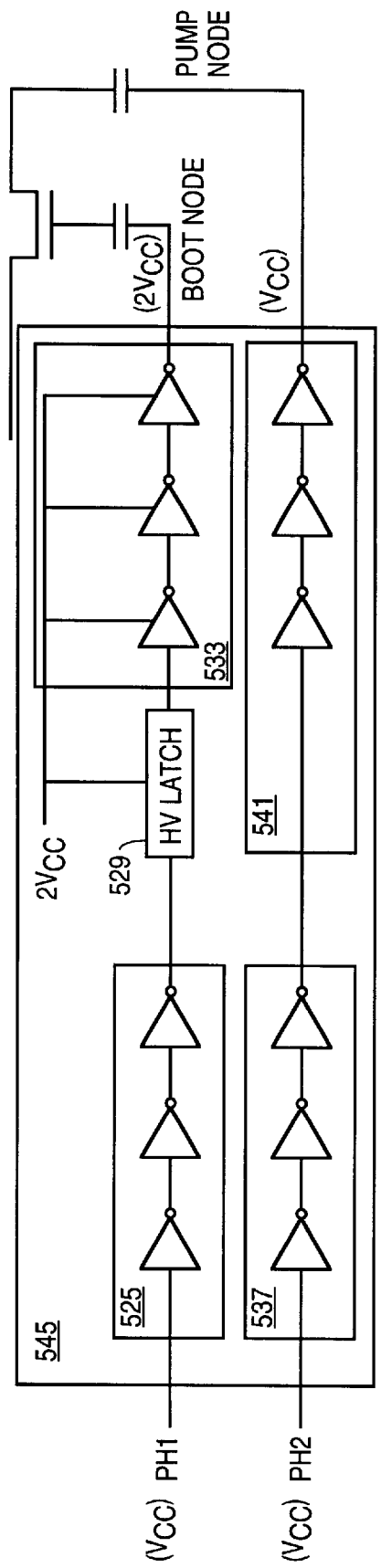
Figure 5C:
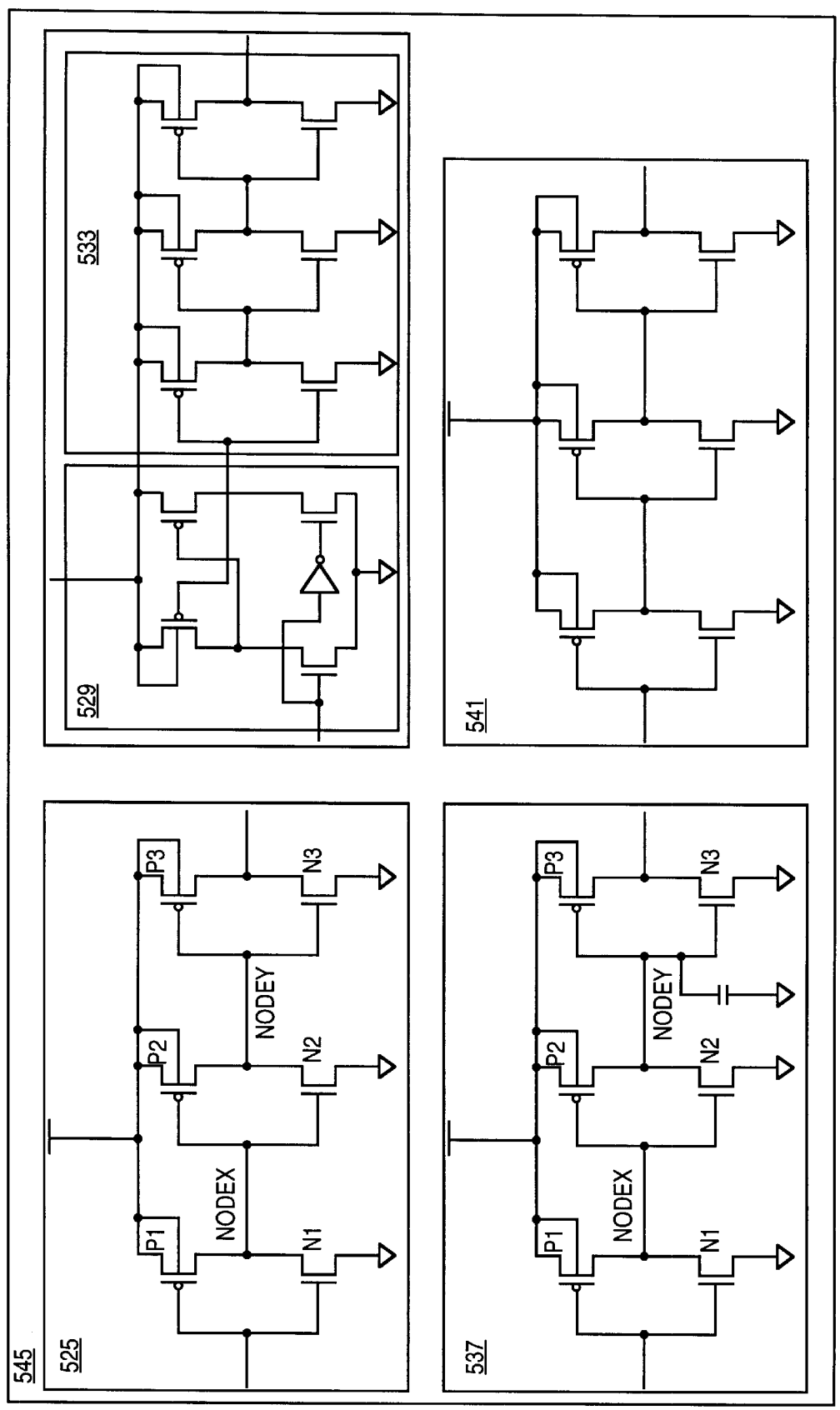

FIG. 5A shows the split clock buffers 146 of FIG. 1 in more detail. Examples of embodiments of the split clock buffers of FIG. 5A are shown in FIGS. 5B and 5C. In FIG. 5A, the voltage controlled oscillator 147 and the clock driver 144 work cooperatively to produce the clock signals 1–4 shown in FIG. 3. For one embodiment, the voltage controlled oscillator 147 receives Vcc from the bus 110 and produces a clock signal CLK at an output. The CLK signal is provided to a clock driver, or phase generator 505 configured on the clock driver 144 that generates four different phases, PH1–PH4 of the CLK signal at its outputs.

Figure 5D:
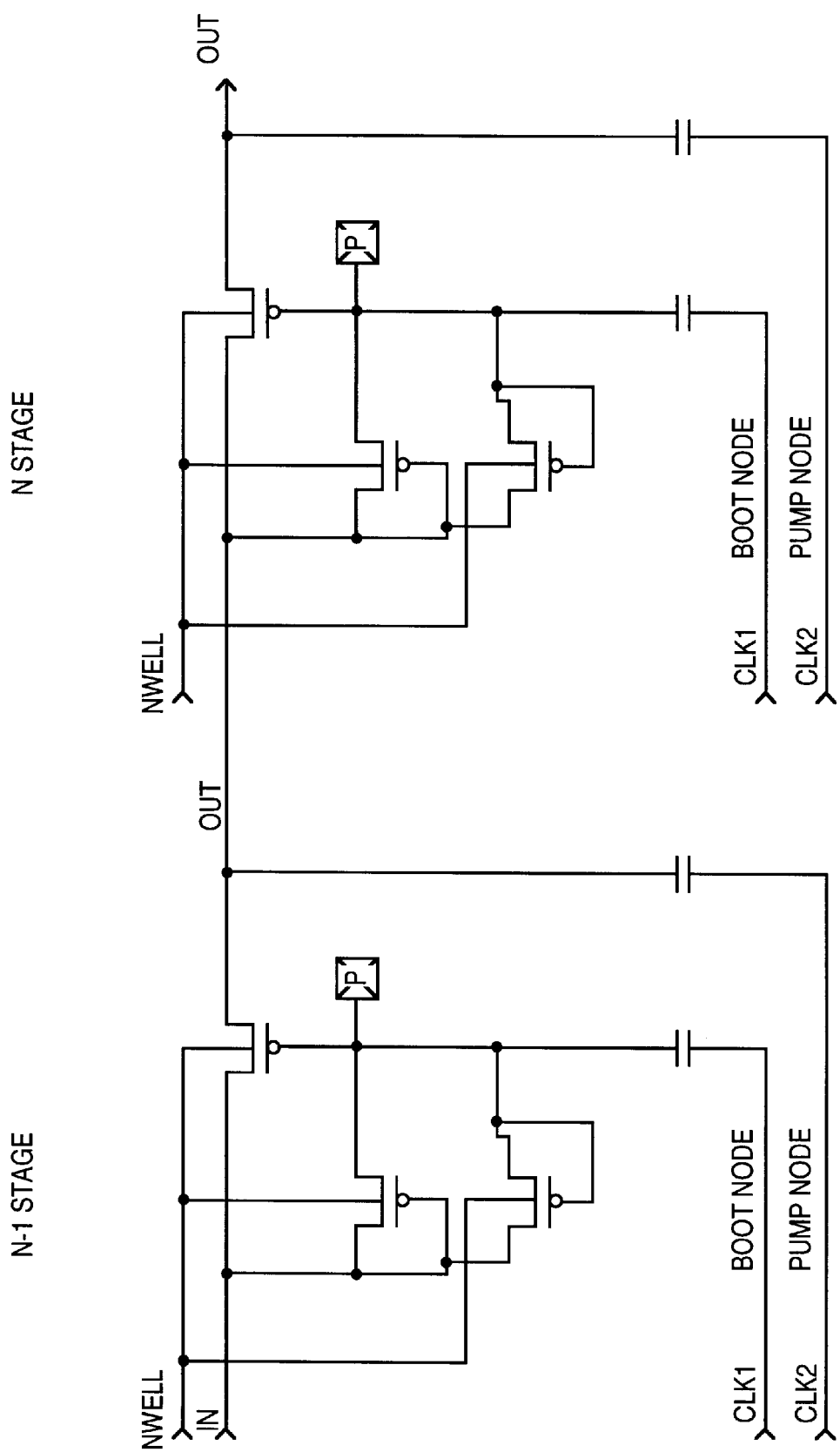
FIG. 5D shows the four phases of the clock signal applied to the negative charge pump.

The PH1–PH4 signals each have a magnitude of Vcc at the output of the phase generator 505. The PH1 and PH3 signals are used to control the boot nodes of the negative charge pump 145. The timing of the PH2 and PH4 signals are used to control the pump nodes of the negative charge pump 145. The four phases of the clock signal thus provide the timing signals used to pump the charge from the N−1 stage of the negative charge pump to the N stage of the negative charge pump, as shown in FIG. 5D.

However, if the clock driver 144 is used to directly drive all of the pump cells of charge pump 145, clock driver 144 will also have to drive all of the pump stage capacitance and layout parasitics. This will result in poor timings (rise, fall, overlap, non-overlap, and boot times), and a reduction in pump output current. The size of the pump must then increase for a required load current. Also, when the power supply is scaled, the driver size must be increased drastically to drive the pump stages. The increase in the driver size also leads to increased power consumption due to self-capacitance of the driver.

Therefore, a split clock buffer 545, 547 delay chain with a high voltage level shifter (or HV latch) 529, 531 for each stage of the charge pump 145 is used to reduce load capacitance to the driver 144 and to boost the pump signals PH1 and PH3 to a higher voltage level provided by a high voltage source 205. Each of the pump cells in a parallel stage has its own buffer section, or split clock buffer, such as N stage split clock buffer 547 for the N stage pump cell of negative charge pump 145. There is still a need for a common clock driver 144 to drive the customized buffer stages. But now the driver 144 only has to contend with considerably lesser load capacitance presented by the buffers 545, 547.

Figure 5E:
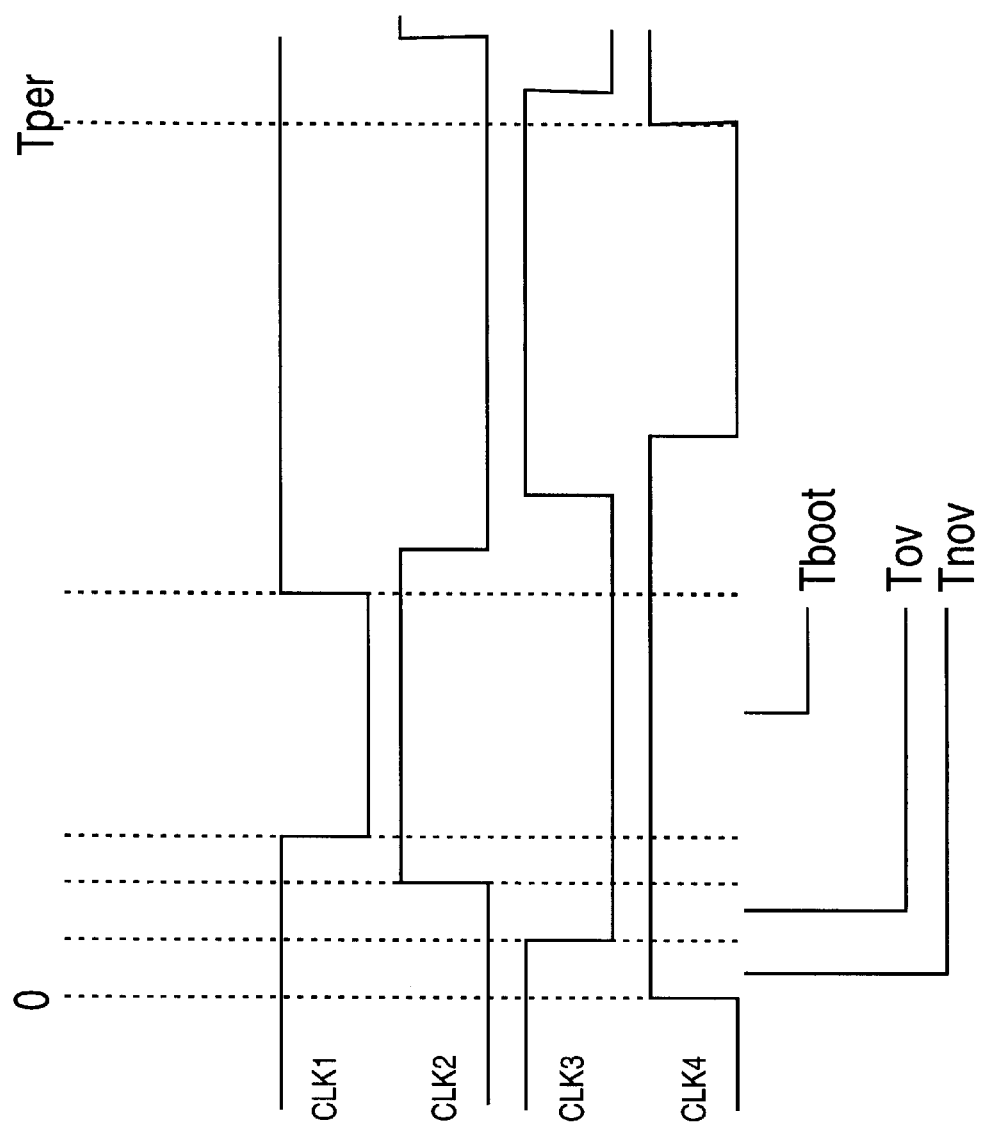
FIG. 5E shows the timing relationship between the four phases.

The buffers themselves act as repeaters and faithfully reproduce the clocks to the pump stages. In the process, the buffers are able to present excellent timings (rise and fall times) to the pump stages. Rise and fall times in the sub-nano second range (as opposed to a couple of nano seconds in the previous designs) have been realized under extreme operating conditions. In one example, the operating conditions were Vcc=1.55V, Temperature=100 degrees C., process skew=Slow corner. The sub-nano second rise/fall times allow for a tight packing of the timing edges and makes it possible to operate the pump at higher frequencies for the same overlap, nonoverlap, and boot times. The reciprocal pump frequency is given by:

$$1/f = Tper = 2*[(2*Tr)+(2*Tf)+Tov+(2*Tnov)+Tboot]$$

where f represents frequency, Tper represents the time period, Tr represents the rise time, Tf represents fall time, Tov represents overlap time, Tnov represents nonoverlap time, and Tboot represents boot time. Tr and Tf are considerable portions of Tper. Therefore, reducing the rise/fall time is important for achieving higher frequency of operation for the charge pump. An example of the phase relationships between the four phases are shown in FIG. 5E.

The voltage level of the PH1 and PH3 phases of the clock signal is increased. A high voltage source 205 is used to boost the voltage level of the pump phases of the clock signal to overcome device threshold voltage in the pump cells. A high voltage level shifter 529, 531 is then required to convert the voltage level of the clock signals (with a Vcc swing) to their boosted voltage levels. Each split buffer 545, 547 serves to drive the level shifters and in turn presents a manageable capacitive loading to the clock driver 144. The pump delays 537, 539 and boot delays 525, 527 serves to eliminate any temporal skews between the four phases of the clock signal originating from the clock driver before the phases finally arrive at the pump cells of pump 145.

The N stage split clock buffer 547 includes a voltage translator that is used to boost the voltage level of PH3 of the clock signal from Vcc to 2Vcc. The voltage translator, or clock pump 531, receives a 3.1 volt signal from an internal stage of one of the positive charge pumps 142 (FIGS. 1 and 2) or other voltage increasing circuitry. The 8-volt charge pump 205 is used in this example to provide the 3.1 volt clock pumping supply. Alternatively, any positive charge pump may be used. 3.1 volts is approximately equal to twice Vcc where Vcc is equal to 1.8 volts +/−150 mV so the 3.1 volt signal may be extracted from the first stage of the 8 volt charge pump 205, for example.

The voltage translator 529, 531 uses the 3.1 volt power supply signal to pump the magnitude of the PH 1 and PH 3 signals to 3.1 volts to provide the clock 1 and clock 3 signals at its outputs. The clock 1 and clock 3 signals are provided to the negative charge pump 145 in the manner described above with reference to FIG. 3. The pumped clock signals clock 1P and clock 3P of FIG. 4 may be generated in a similar manner.

Figure 7:
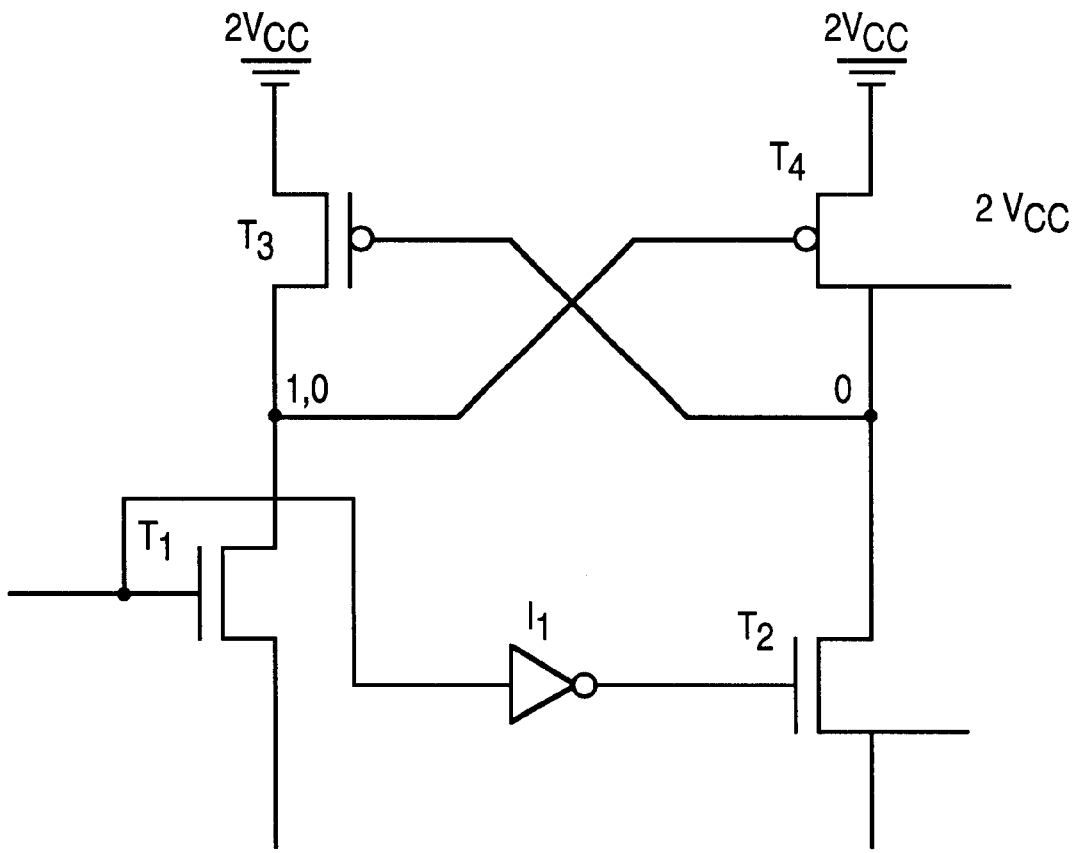
FIG. 7 shows one embodiment of a voltage translator of FIG. 5.

In one embodiment, the voltage translator can be a high voltage latch as shown in FIG. 7. When the input clock signal PH3 is 0, transistor T1 is off, causing the output of inverter In to go high. Transistor T2 is turned on, which turns on transistor T3. The high output from T3 goes to T4, which is thus turned off. The output is therefore off. When T1 is high, T2 is low, and T3 is off. T4 is therefore on, and the output signal is the clock signal PH3 having a voltage swing from 0 to 2Vcc.

The output of the voltage translator 531 is fed into a boot buffer 535. The load to the translator 531 from the boot buffer 535 is less than the load from the boot node of the pump 145. Therefore, the buffer 535 acts as a repeater, and makes the rise and fall timings sharp. Without the buffer 535, the signal PH3 would have rise and fall slopes that last longer, thus reducing frequency and current to the pump 145.

The PH3 signal, before going into the voltage translator 531, goes into a boot delay 527. The boot delay reduces the load to the phase generator 144. The PH4 signal goes into a pump delay 539, which also reduces the load to the phase generator 144. The PH4 signal then goes into a pump buffer 543. The pump buffer 543 is designed to match the delay from the voltage translator and the boot buffer.

Referring back to FIG. 3, the pumped output voltage of the charge pump 145 at the output node Vout fluctuates due to the charging and discharging of capacitors in the circuit. In order to supply a precise negative voltage to be used for flash memory cell erase operations, for example, a voltage regulator circuit such as the voltage regulator circuit 150 (FIG. 2) may be used.

Figure 6:
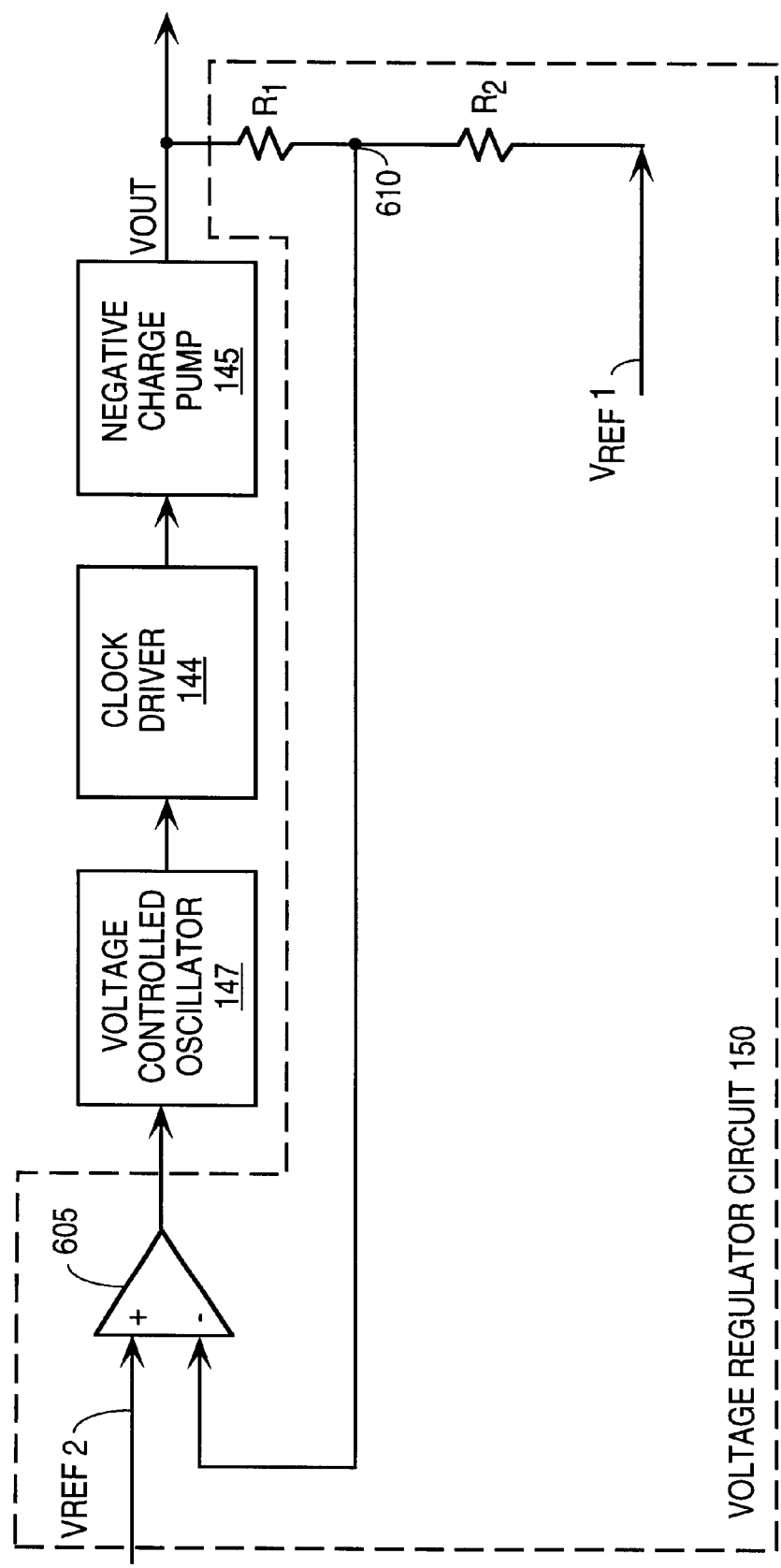
FIG. 6 shows a circuit of one embodiment for controlling the output voltage of the negative charge pump of FIG. 3.

FIG. 6 shows the voltage regulator circuit 150 of one embodiment in more detail. The voltage regulator circuit 150 is coupled to an input of the voltage controlled oscillator 147. The voltage controlled oscillator 147 is coupled to an input of the clock driver 144 which provides the clock 1–4 signals that control operation of the negative charge pump 145.

The voltage regulator circuit 150 controls the operation of the negative charge pump 145 by controlling when the voltage controlled oscillator 147 is enabled to provide clock signals through the clock driver 144. In this manner, the negative charge pump 145 can be turned on when the pumped output voltage Vout at the output of the charge pump 145 is lower in magnitude (i.e. more positive) than the desired output voltage and/or turned off when Vout is higher in magnitude (i.e. more negative) than desired.

The voltage regulator circuit 150 includes two resistors R1 and R2 coupled in series with the output node Vout of the charge pump 145 to form a voltage divider. An opposite end of the series-coupled resistors R1 and R2 is coupled to a first reference voltage Vref 1. It will be appreciated by those skilled in the art that the voltage divider of FIG. 6 may be formed in another manner such as by a series of diode-connected transistors, for example.

The voltage regulator circuit 150 also includes a comparator circuit 605 which may be a differential amplifier for one embodiment. One input of the comparator circuit 605 is coupled to a node 610 of the voltage divider formed of the resistors R1 and R2. Another input of the comparator circuit 605 is coupled to a second reference voltage Vref 2. For one embodiment, Vref 1 has a value of 4 volts while Vref 2 has a value of 1 volt. For this embodiment, the resistances R1 and R2 are selected such that when the voltage at the output node Vout is at the desired level (−10.5 volts for the embodiment described with reference to FIG. 3), the voltage at the node 610 is equal to approximately 1 volt. For different reference voltage levels and/or different desired values for the output voltage Vout, the values of the resistors R1 and R2 may be selected in another manner. Further, different reference voltage Vref 1 and Vref 2 may be used for other embodiments.

In operation, if the level of Vout is greater (i.e. more positive) than the output voltage level desired (−10.5 volts for the embodiment shown in FIG. 3), then the value of the input at the positive terminal of the comparator circuit 605 is more positive than the level provided at the negative terminal of the comparator circuit 605. This input condition of the comparator circuit 605 keeps the voltage controlled oscillator 147 turned on and gradually increases the output of the charge pump 145.

When the level of Vout becomes less (i.e. more negative) than the level desired, then the value of the input at the positive terminal of the comparator circuit 605 is less positive than the level provided at the negative terminal of the comparator circuit 605. This input condition of the comparator circuit 605 turns the voltage controlled oscillator 147 off and gradually decreases the negative output voltage Vout as the voltage buildup on the output capacitance gradually dissipates. In this manner, the voltage level produced at the output of the negative charge pump 145 may be regulated to provide a relatively constant level for Vout.

A voltage regulator circuit similar to the voltage regulator circuit of FIG. 6 may also be used to regulate a positive charge pump such as the charge pump 400 of FIG. 4. The reference voltage values and/or resistor values (where resistors are used) for such a circuit may be selected for a different desired value of Vout. Other types of voltage regulator circuits may also be used for various embodiments.

Figure 8:
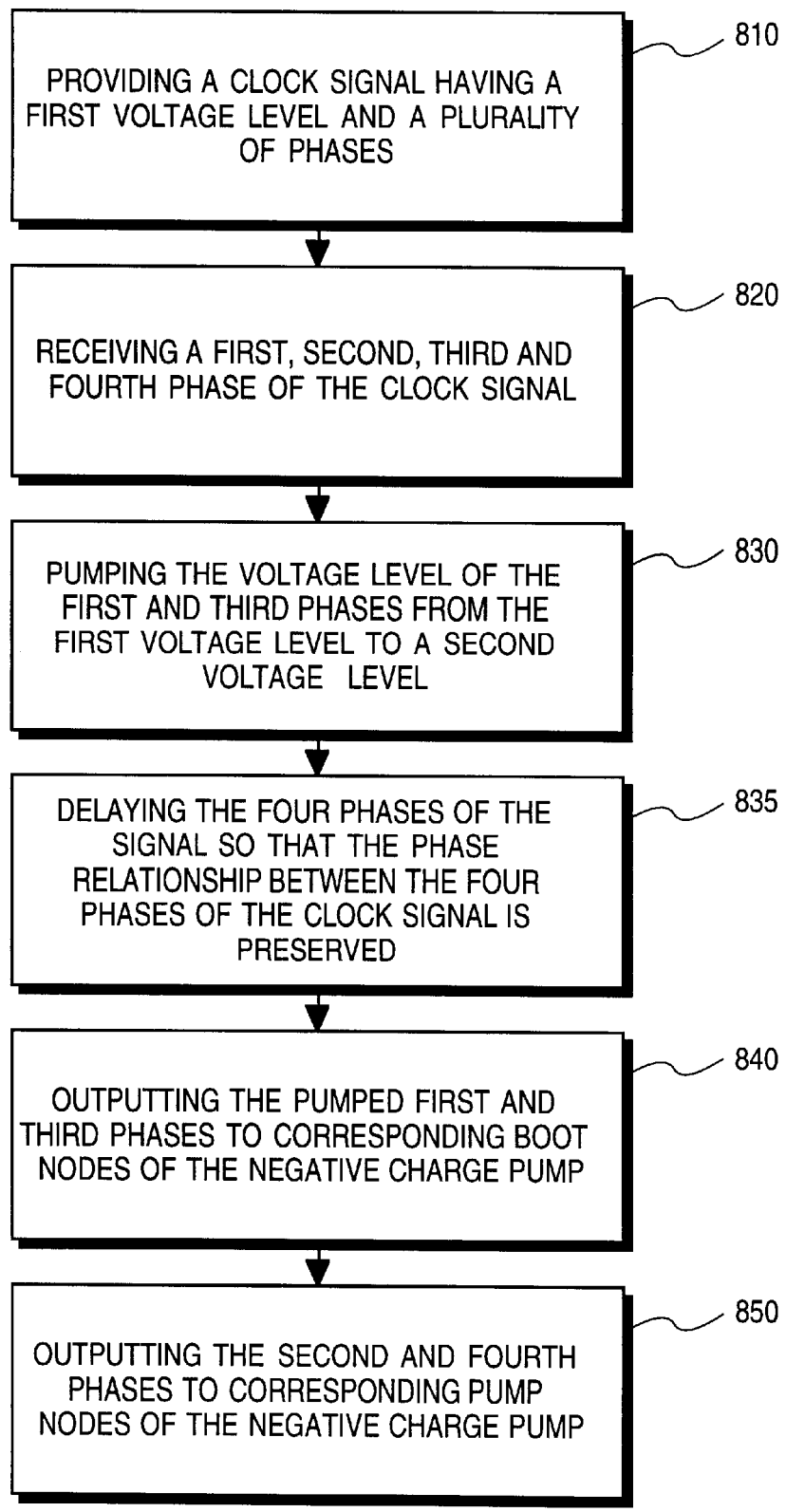
FIG. 8 shows a method for providing clock signals to a charge pump.

FIG. 8 shows a method for providing clock signals to a negative charge pump. Providing a clock signal having a first voltage level and a plurality of phases is step 810. A first, second, third and fourth phase of the clock signal are received, step 820. The voltage level of the first and third phases from the first voltage level to a second voltage level are pumped, step 830. The four phases of the clock signal are delayed, so that the phase relationship of the four phases is maintained, step 835. The pumped first and third phases to corresponding boot nodes of the negative charge pump are output to the negative charge pump, step 840. The second and fourth phases to corresponding pump nodes of the negative charge pump are output, step 850.

What is claimed is:

1. A device for providing clock signals to a negative charge pump comprising:
    a clock signal having a first voltage level and a plurality of phases;
    a first split clock buffer configured to receive a first phase and a second phase of the clock signal, pump the voltage level of the first phase from the first voltage level to a second voltage level, output the pumped first phase to a boot node of the negative charge pump, and output the second phase to a pump node of the negative charge pump.

2. The device of claim 1, wherein the first split clock buffer further comprises a voltage translator configured to pump the voltage level of the first phase of the clock signal.

3. The device of claim 2, wherein the voltage translator is a high voltage latch.

4. The device of claim 2, wherein the first split clock buffer further comprises a boot delay located in front of the input to the voltage translator, wherein the load of the boot delay is less than the load of the voltage translator.

5. The device of claim 4, further comprising a boot buffer connected to the output of the voltage translator, wherein the load of the boot buffer is less than the load of the negative charge pump.

6. The device of claim 5, wherein the output of the boot buffer is connected with a boot node of the negative charge pump.

7. The device of claim 6, further comprising:
    a pump delay for receiving a second phase of the clock signal, wherein the load of the pump delay is less than the load of the negative charge pump.

8. The device of claim 7, further comprising:
    a pump buffer connected to the output of the pump delay, wherein said pump buffer preserves the phase relationship between the first and second phases of the clock signal.

9. The device of claim 8, wherein the output of the pump delay is connected to a pump node of the negative charge pump.

10. The device of claim 1, further comprising:
    a second split clock buffer configured to receive a third phase and a fourth phase of the clock signal, pump the voltage level of the second phase from the first voltage level to a second voltage level, output the pumped second phase to a second boot node of the negative charge pump, and output the fourth phase to a second pump node of the negative charge pump.

11. A device for providing clock signals to a negative charge pump comprising:
    means for providing a clock signal having a first voltage level and a plurality of phases;
    means for receiving a first phase and a second phase of the clock signal, pumping the voltage level of the first phase from the first voltage level to a second voltage level, outputting the pumped first phase to a boot node of the negative charge pump, and outputting the second phase to a pump node of the negative charge pump.

12. The device of claim 11, wherein the means for receiving comprises a voltage translator configured to pump the voltage level of the first phase of the clock signal.

13. The device of claim 12, wherein the voltage translator is a high voltage latch.

14. The device of claim 12, wherein the means for receiving further comprises a boot delay located in front of the input to the voltage translator, wherein the load of the boot delay is less than the load of the voltage translator.

15. The device of claim 14, further comprising a boot buffer connected to the output of the voltage translator, wherein the load of the boot buffer is less than the load of the negative charge pump.

16. The device of claim 15, wherein the output of the boot buffer is connected with a boot node of the negative charge pump.

17. The device of claim 16, further comprising:
    a pump delay for receiving a second phase of the clock signal, wherein the load of the pump delay is less than the load of the negative charge pump.

18. The device of claim 17, further comprising:
    a pump buffer connected to the output of the pump delay, wherein said pump buffer preserves the phase relationship between the first and second phases of the clock signal.

19. The device of claim 18, wherein the output of the pump delay is connected to a pump node of the negative charge pump.

20. The device of claim 11, further comprising:
    means for receiving a third phase and a fourth phase of the clock signal, pumping the voltage level of the second phase from the first voltage level to a second voltage level, outputting the pumped second phase to a second boot node of the negative charge pump, and outputting the fourth phase to a second pump node of the negative charge pump.

21. A method for providing clock signals to a negative charge pump comprising:
    providing a clock signal having a first voltage level and a plurality of phases;
    receiving a first phase and a second phase of the clock signal;
    pumping the voltage level of the first phase from the first voltage level to a second voltage level;
    outputting the pumped first phase to a boot node of the negative charge pump; and
    outputting the second phase to a pump node of the negative charge pump.

22. The method of claim 21, wherein a voltage translator pumps the voltage level of the first phase of the clock signal.

23. The method of claim 22, wherein the voltage translator is a high voltage latch.

24. The method of claim 22, further comprising delaying the received first phase of the clock signal.

25. The method of claim 24, further comprising delaying the received second phase of the clock signal.

26. The method of claim 25, wherein:
delaying the received first phase and delaying the received second phase preserves the phase relationship between the first and second phases of the clock signal.

27. The method of claim 21, further comprising:
receiving a third phase and a fourth phase of the clock signal;
pumping the voltage level of the second phase from the first voltage level to a second voltage level;
outputting the pumped second phase to a second boot node of the negative charge pump; and
outputting the fourth phase to a second pump node of the negative charge pump.

28. The method of claim 27, further comprising delaying the received third phase of the clock signal.

29. The method of claim 28, further comprising delaying the received fourth phase of the clock signal.

30. The method of claim 29, wherein:
delaying the received third phase and delaying the received fourth phase preserves the phase relationship between the third and fourth phases of the clock signal.

31. A device for providing clock signals to a negative charge pump comprising:
a clock signal having a first voltage level and a plurality of phases;
a first split clock buffer having
a first boot delay that receives a first phase of the clock signal at a first boot delay input and outputs the first phase at a first boot delay output;
a first pump delay that receives a second phase of the clock signal at a first pump delay input and outputs the second phase at a first pump delay output connected with a pump node of the negative charge pump; and
a first voltage translator connected with the first boot delay output, the first voltage translator pumps the level of the first phase from the first voltage level to a second voltage level and outputs the pumped first phase to a boot node of the negative charge pump.

32. The device of claim 31, wherein the first voltage translator is a high voltage latch.

33. The device of claim 32, further comprising a first boot buffer having a first boot buffer input connected with the output of the voltage translator, and a first boot buffer output connected with a boot node of the negative charge pump.

34. The device of claim 33, wherein:
the first boot delay comprises one or more inverter circuits.

35. The device of claim 34, wherein:
the first boot buffer comprises one or more inverter circuits.

36. The device of claim 35, wherein the first pump delay comprises one or more inverter circuits.

37. The device of claim 31, further comprising:
a second split clock buffer having a second boot delay that receives a third phase of the clock signal at a second boot delay input and outputs the third phase at a second boot delay output;
a second pump delay that receives a fourth phase of the clock signal at a second pump delay input and outputs the fourth phase at a second pump delay output connected with a second pump node of the negative charge pump; and
a second translator connected with the second boot delay output, the second voltage translator pumps the level of the third phase from the first voltage level to a second voltage level and outputs the pumped third phase to a second boot node of the negative charge pump.

* * * * *